(12) United States Patent
Lim et al.

(10) Patent No.: US 8,003,529 B2
(45) Date of Patent: Aug. 23, 2011

(54) METHOD OF FABRICATION AN INTEGRATED CIRCUIT

(75) Inventors: Suh Fei Lim, Singapore (SG); Kok Wai Chew, Singapore (SG); Sanford Shao-Fu Chu, Singapore (SG); Michael Chye Huat Cheng, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 12/693,405

(22) Filed: Jan. 25, 2010

(65) Prior Publication Data
US 2010/0120244 A1 May 13, 2010

Related U.S. Application Data

(62) Division of application No. 11/832,642, filed on Aug. 1, 2007, now Pat. No. 7,652,355.

(51) Int. Cl.
 *H01L 21/44* (2006.01)
(52) U.S. Cl. .......... 438/657; 438/666; 257/659
(58) Field of Classification Search .......... 438/657, 438/666; 257/331, 531, 659, E23.004
See application file for complete search history.

(56) References Cited

U.S. PATENT DOCUMENTS

| | | | |
|---|---|---|---|
| 2,847,651 A | 8/1958 | Schamanek | |
| 6,031,445 A | 2/2000 | Marty et al. | |
| 6,114,937 A | 9/2000 | Burghartz et al. | |
| 6,476,704 B2 | 11/2002 | Goff | |
| 6,593,838 B2 * | 7/2003 | Yue | 336/84 C |
| 6,825,749 B1 | 11/2004 | Lin et al. | |
| 6,833,603 B1 | 12/2004 | Park et al. | |
| 6,905,889 B2 | 6/2005 | Lowther | |
| 6,974,740 B2 * | 12/2005 | Lowther et al. | 438/214 |
| 7,164,339 B2 | 1/2007 | Huang | |

(Continued)

FOREIGN PATENT DOCUMENTS

DE 10261385 A1 7/2004

(Continued)

OTHER PUBLICATIONS

J. R. Long, Monolithic Transformers for Silicon RF IC Design, IEEE Journal of Solid-State Circuits, Sep. 2000, pp. 1368-1382, vol. 35, No. 9.

(Continued)

*Primary Examiner* — Phuc T Dang
(74) *Attorney, Agent, or Firm* — Horizon IP Pte. Ltd.

(57) ABSTRACT

A method of forming an integrated circuit is disclosed. The method includes providing a substrate and forming on the substrate a shield structure comprising a shield member and a ground strap. The shield member comprises a non-metallic portion, and the ground strap comprises a metallic portion.

26 Claims, 6 Drawing Sheets

U.S. PATENT DOCUMENTS

| | | |
|---|---|---|
| 2001/0050607 A1 | 12/2001 | Gardner |
| 2002/0084509 A1 | 7/2002 | Ballantine et al. |
| 2002/0096736 A1 | 7/2002 | Brennan et al. |
| 2003/0011458 A1 | 1/2003 | Nuytkens et al. |
| 2003/0071706 A1 | 4/2003 | Christensen |
| 2003/0141501 A1 | 7/2003 | Komurasaki et al. |
| 2003/0229982 A1 | 12/2003 | Vilander et al. |
| 2004/0007760 A1 | 1/2004 | Lowther |
| 2004/0017278 A1 | 1/2004 | Castaneda et al. |
| 2004/0046630 A1 | 3/2004 | Gardner |
| 2004/0056749 A1 | 3/2004 | Kahlmann et al. |
| 2004/0095222 A1 | 5/2004 | Liang et al. |
| 2004/0183156 A1 | 9/2004 | Lowther |
| 2005/0128038 A1 | 6/2005 | Hyvonen |
| 2006/0001520 A1 | 1/2006 | Kaji et al. |
| 2006/0202789 A1 | 9/2006 | Hyvonen |

FOREIGN PATENT DOCUMENTS

| | | |
|---|---|---|
| EP | 0649152 A2 | 8/1990 |
| EP | 1426983 A1 | 6/2004 |
| EP | 1655746 A2 | 5/2006 |
| EP | 1032001 A1 | 8/2008 |
| GB | 2381129 A | 4/2003 |
| JP | 2002184945 | 6/2002 |
| JP | 2004288781 | 10/2004 |
| JP | 2005236033 | 9/2005 |
| WO | 9850956 | 11/1998 |
| WO | 0045399 | 8/2000 |
| WO | 0067320 | 11/2000 |
| WO | 0146971 A1 | 6/2001 |
| WO | 02065492 A2 | 8/2002 |
| WO | 2004102665 A1 | 11/2004 |

OTHER PUBLICATIONS

J. J. Zhou et al., Monolithic Transformers and Their Application in a Differential CMOS RF Low-Noise Amplifier, IEEE Journal of Solid-State Circuits, Dec. 1998, pp. 2020-2027, vol. 33, No. 12.

S.S. Mohan et al., Modeling and Characterization of On-Chip Transformers, 1998 International Electron Devices Meeting Technical Digest, Dec. 6-9, 1998, pp. 531-534.

I. Aoki et al., Fully Integrated CMOS Power Amplifier Design Using the Distributed Active-Transformer Architecture, IEEE journal of Solid-State Circuits, Mar. 2002, pp. 371-383, vol. 37, No. 3.

J.R. Long et al., The Modeling, Characterization, and Design of Monolithic Inductors for Silicon RF IC's. IEEE Journal of Solid-State Circuits, Mar. 1997, pp. 3357-369, vol. 32, No. 3.

Yo-Sheng Lin et al., Temperature-Dependance of Noise Figure of Monolithic RF Transformers on a thin (20 um) Silicon Substrate, IEEE Electron Device Letters, Mar. 2005, pp. 208-211, vol. 26, No. 3.

Sang-Gug Lee, Area Efficient and Symmetric Design of Monolithic Transformers for Silicon RF ICs, Tencon 99. Proceedings of the IEEE Region 10 Conference, Dec. 1999, pp. 880-882, vol. 2.

* cited by examiner

METHOD OF FABRICATION AN INTEGRATED CIRCUIT

CROSS-REFERENCE TO RELATED APPLICATION

This application is a divisional application which claims benefit of copending U.S. patent application Ser. No. 11/832,642, filed on Aug. 1, 2007. All disclosures are incorporated herewith by reference.

FIELD OF THE INVENTION

The present invention relates to an integrated circuit. More particularly, the invention relates to shield structures employed in integrated circuits.

BACKGROUND OF THE INVENTION

Integrated circuits (ICs), such as on-chip radio frequency (RF) ICs employ the use of integrated inductors to perform a range of functions. The inductors are formed on the silicon substrate which is grounded. Typically, the inductors are formed on a dielectric layer formed over the substrate. Inductor coils carrying varying current at high operating frequencies generate magnetic field that penetrates into the substrate below. The magnetic field induces an image current (eddy current) that penetrates into the substrate and flows in the opposite direction as the coil current. The eddy current generates its own field, which opposes the original magnetic field of the inductor. This degrades the quality factor (Q) of the inductor. Additionally, the electric potential difference between the inductor and the grounded silicon substrate creates an electric field across the dielectric layer, pointing towards the substrate. When the coil voltage changes, varying current (displacement current) can flow through the insulating layer to the substrate, causing undesirable power dissipation.

It is therefore desirable to increase quality factor (Q) and reduce power loss of inductors.

SUMMARY OF THE INVENTION

It is an aim of embodiments of the invention to provide an improved shield for an integrated circuit.

It is a further aim of embodiments of the present invention to provide a fabrication method for an improved shield for an integrated circuit.

According to a first aspect of the present invention there is provided an integrated circuit structure comprising: a substrate; a shield structure comprising a shield member and a ground strap formed on the substrate, wherein the shield member comprises a non-metallic portion, and the ground strap comprises a metallic portion.

According to a second aspect of the invention there is provided an integrated circuit structure comprising: a substrate; and a shield member and a ground strap formed on the substrate, wherein the shield member comprises a plurality of conductive regions formed from a non-metallic material and arranged substantially to inhibit an inducement of eddy current in the shield member by a current in an inductor disposed adjacent to a shield portion, and the ground strap comprises a metallic portion.

According to a third aspect of the invention there is provided a method of forming an integrated circuit structure comprising the steps of: providing a substrate; forming on said substrate a shield structure comprising a shield member and a ground strap, whereby the shield member comprises a non-metallic portion, and the ground strap comprises a metallic portion.

According to a fourth aspect of the invention there is provided a shield structure for an integrated circuit comprising: shield elements formed on a substrate wherein the shield elements comprise a first material. The shield structure further comprises a shield strap coupled to the shield elements which comprises a second material wherein the second material comprises a metallic material and is different from the first material.

Some embodiments of the invention have the advantage that a shield structure may be provided having the benefit that a portion of the shield structure is metallic, and therefore of relatively high conductivity. Such a shield structure may be provided without using one of the metallisation levels (e.g. metallisation level 1, M1) to form a portion of the shield structure in a region where said metallisation level might otherwise be used to form a portion of the inductor.

For more mature technology nodes such as 0.25 μm and 0.35 μm, where the number of metal layers available for interconnection is limited, M1 is often used to form part of the interconnect structure of the inductor structure, rather than part of the shield structure. Embodiments of the invention are thereof of particular utility with such technology nodes.

Embodiments of the invention have the advantage that the conductivity of the structure is higher than a structure formed only from a non-metallic material. Embodiments of the invention have the further advantage that the number of metallisation levels available for fabricating the inductor structure is not reduced by the fact that a part of the structure is formed from a metallic material.

In embodiments of the invention, a portion of the shield structure that is within the lateral confines of the inductor is formed from a non-metallic material. Thus, in the case of a transformer structure in which the shield structure is formed in a plane generally parallel to a plane of the inductor, a portion of the shield structure that is within the radial boundary defined by the outer perimeter of the inductor (as viewed along an axis of the inductor normal to the plane of the inductor), is formed from a non-metallic material and not from a metallic material. This feature allows the inductor to be formed to comprise a portion of a metal layer that would otherwise be required to be used to form a portion of the shield structure.

In embodiments of the invention, a ground strap portion of the shield structure is provided outside the lateral confines of the inductor structure, around an outer edge of the shield structure. The ground strap portion is formed from a metallic material.

In embodiments of the invention, a portion of the inductor and said ground strap portion of the shield structure may be formed from the same metal layer. For example, metal 1 (M1) can be used to form both a portion of the inductor (e.g., a portion of an inductor interconnect or inductor track) and at least a portion of the ground strap portion of the shield structure.

BRIEF DESCRIPTION OF DRAWINGS

Embodiments of the present invention will now be described hereinafter, by way of example only, with reference to the accompanying drawings, in which.

Figure 3:
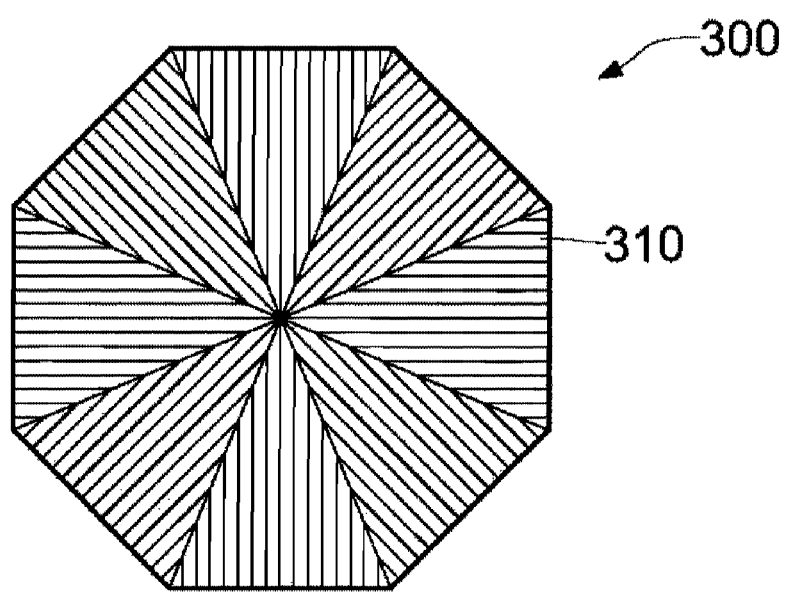
Figure 4:
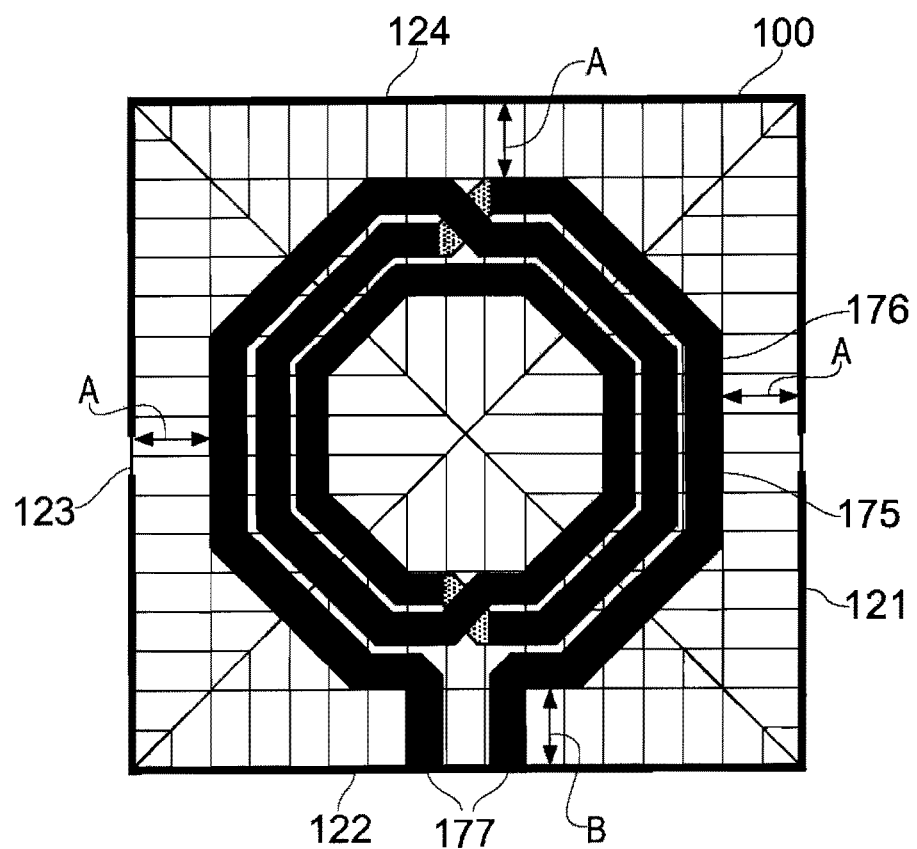
Figure 5:
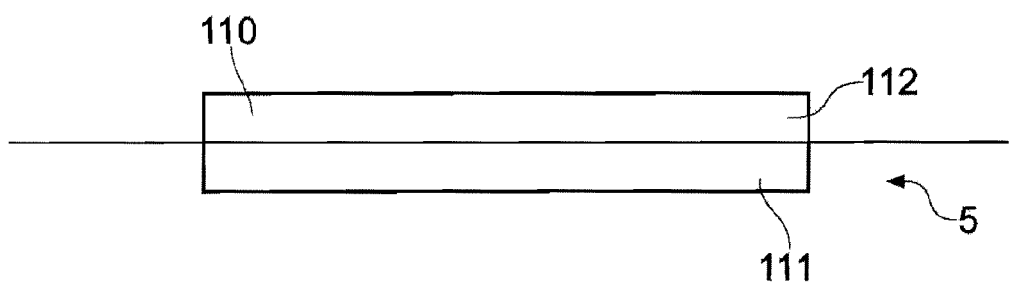
Figure 6:
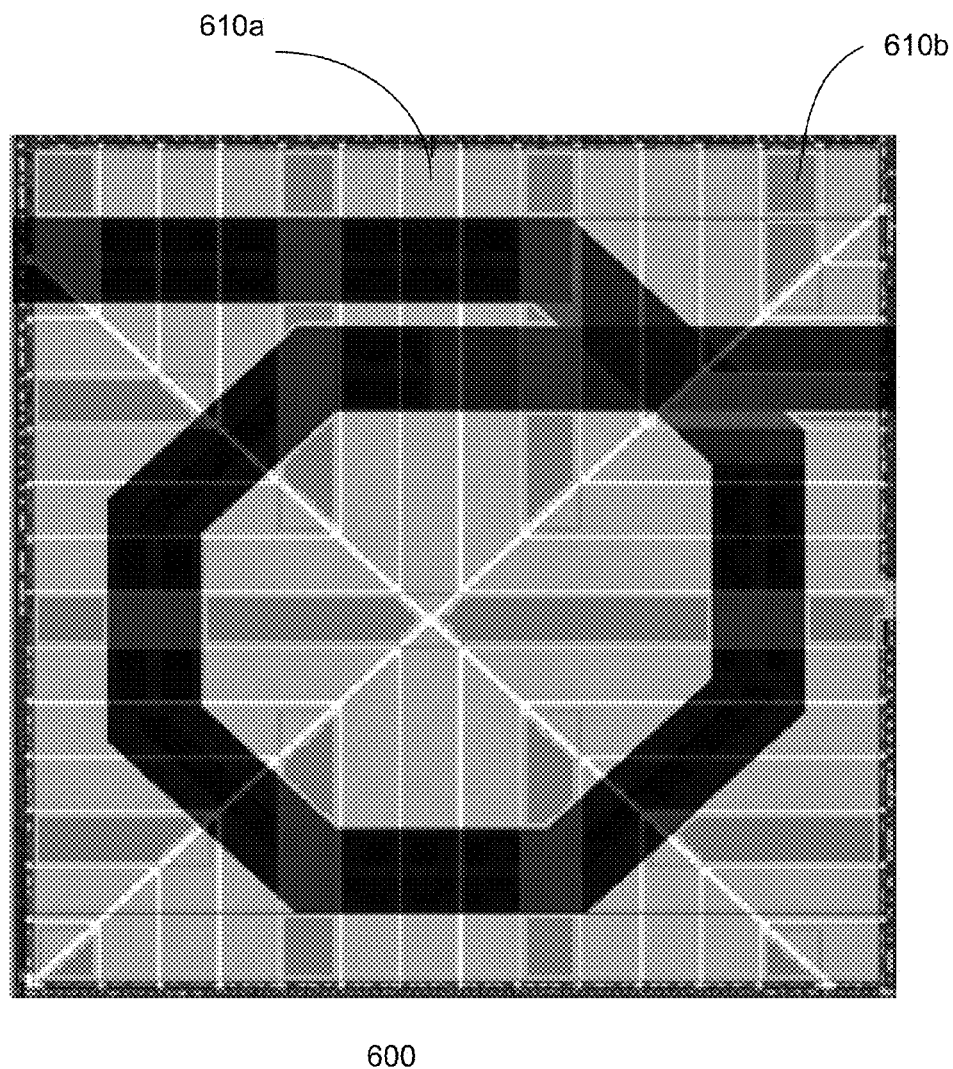

without a shield structure, (b) in accordance with one embodiment of the invention and (c) with a conventional shield structure;

FIG. 3 is a schematic illustration of a shield structure according to an embodiment of the invention;

FIG. 4 is a schematic illustration of a shield structure according to one embodiment of the invention;

FIG. 5 is a schematic illustration of a shield structure according to an embodiment of the invention; and FIG. 6 shows a schematic illustration of a shield structure in accordance with an alternative embodiment of the invention.

DETAILED DESCRIPTION OF THE INVENTION

The following embodiments are intended to illustrate the invention more fully without limiting their scope, since numerous modifications and variations will be apparent to those skilled in the art.

Figure 1:
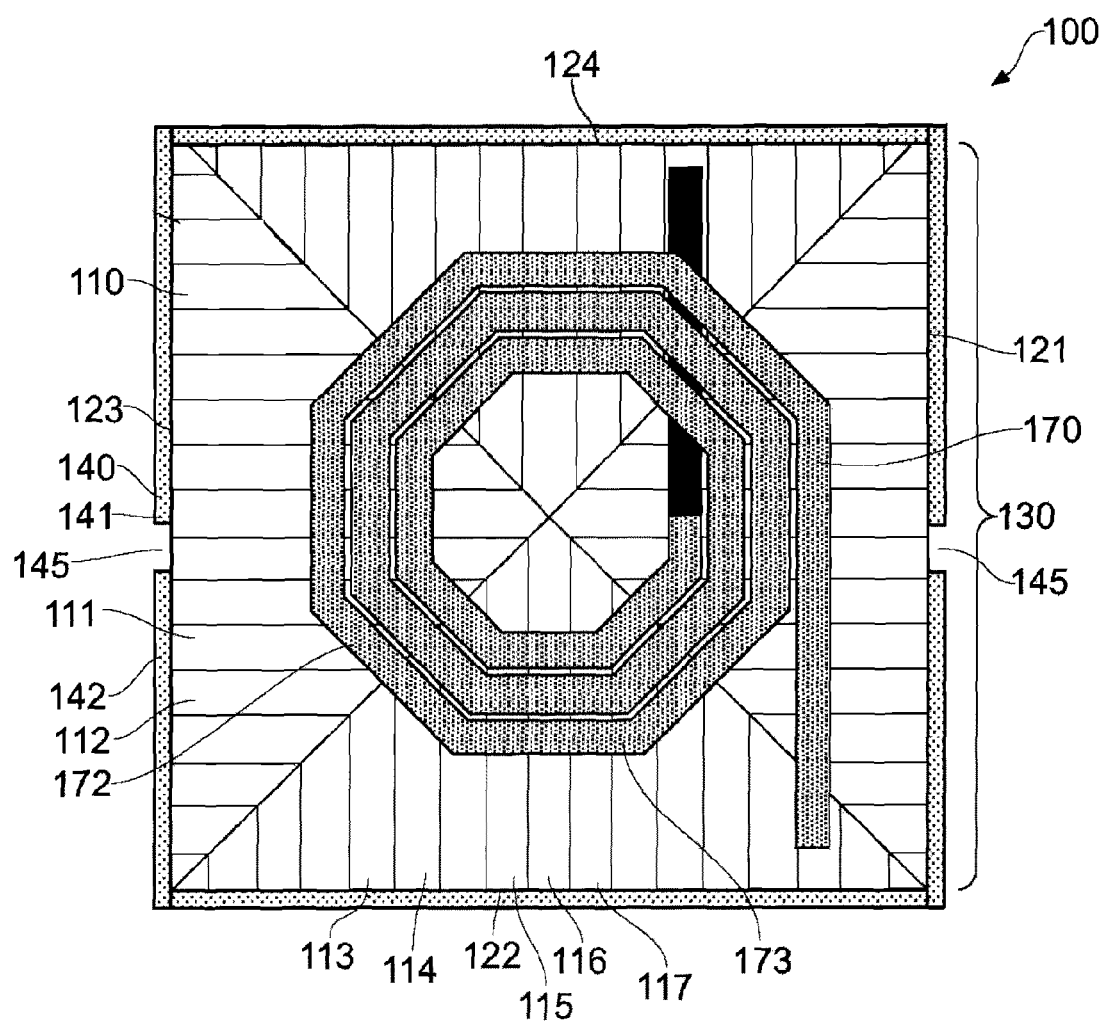
FIG. 1 is a schematic illustration of a shield structure according to one embodiment of the invention.
Figure 2:
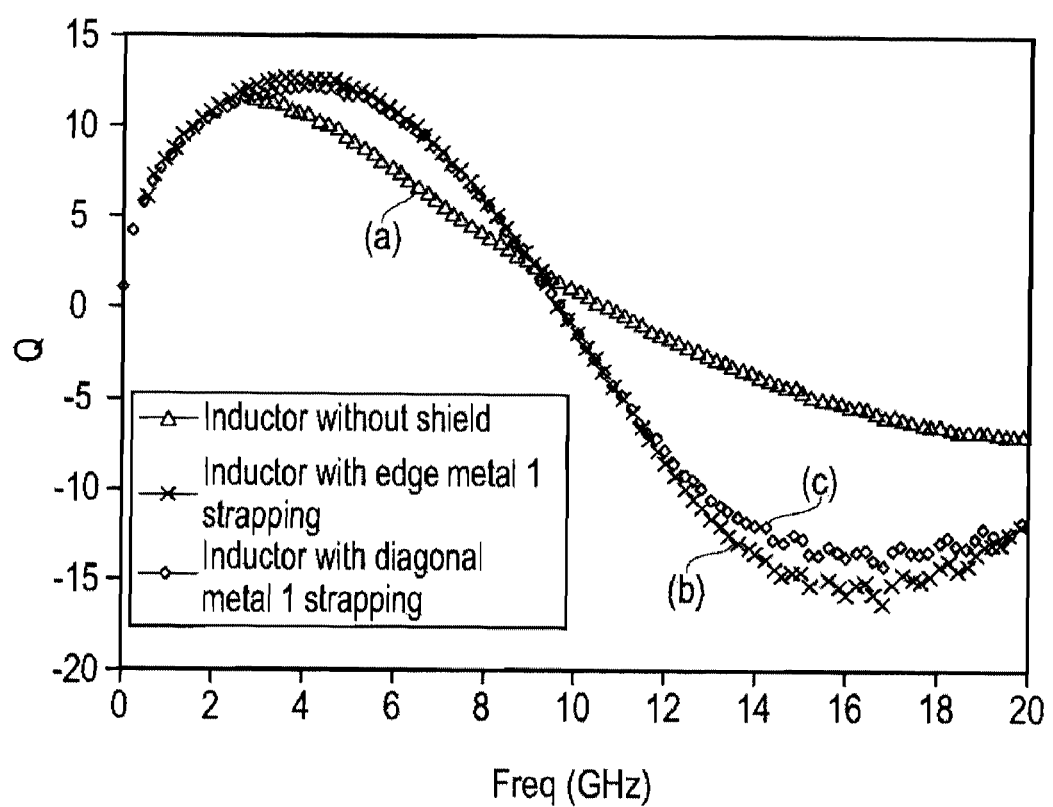
FIG. 2 is a graphical plot of quality factor Q as a function of frequency for an inductor formed on a silicon substrate (a)

FIG. 1 shows a shield structure 100 according to one embodiment of the invention. The shield structure can be formed on, for example, a silicon oxide layer on a substrate of an integrated circuit (IC), such as an RF IC. The substrate typically comprises a silicon substrate. Forming the ground shield on other types of substrates, such as gallium arsenide, silicon germanium, or any other suitable substrate or other types of ICs is also useful. The shield structure is located below an inductor 170. Alternatively, the shield structure can be formed on the substrate, for example, near the interface of the silicon oxide layer. The term "substrate" as used herein can refer to a substrate or to a substrate with layers formed thereon.

The shield structure shields circuit elements from electric fields generated by, for example, the inductor. The inductor, in one embodiment, comprises an inductor axis. The inductor member axis is arranged to be substantially normal to a plane of the shield and passing through a centre of the inductor.

In one embodiment, the shield structure comprises a surface area larger than an inductor 170. Preferably, the surface area is sufficiently large to shield circuit elements from fringing electric fields of the inductor. The distance which the shield extends beyond the inductor, for example, is about 10 μm to about 55 μm. Preferably, the distance which extends beyond the inductor is about 35 μm. Other distances are also useful.

In accordance with one embodiment of the invention, the shield structure comprises a plurality of shield elements 110 separated by slots 111. The shield elements serve as locally isolated conductive lines which are mutually grounded by a ground strap 140. In one embodiment, the ground strap and the shield elements are disposed on different planes of the IC. For example, the ground strap is located on a metal layer above the shield elements. To connect the ground strap and shield elements on the different levels, contacts can be provided. The shield elements can also be patterned such that they are coupled on one side, for example, on the side where the ground strap is to be coupled by contacts.

In one embodiment, the shield elements comprise a first conductive material and the ground strap comprises a second conductive material. The first conductive material comprises polysilicon. Preferably, the first conductive material comprises doped salicided polysilicon. Other types of conductive materials are also useful. The second conductive material comprises a metallic material. Preferably, the second conductive material comprises a metallic material used in the first metal layer of the IC. Typically, the second conductive material comprises copper. Other types of metallic materials are also useful.

The shield elements are arranged to reduce or prevent the flow of eddy currents induced by the inductor. In one embodiment, the shield elements are arranged to be substantially perpendicular to the inductor's coils or lines to reduce or prevent the flow of eddy currents induced by the inductor. The slots separating the shield elements are preferably sufficiently narrow to reduce or prevent the penetration of electric field of the inductor to the substrate. The shield elements are preferably sufficiently wide to reduce or prevent noise.

As shown, the shield structure comprises a rectangular shape with an octagonal shaped inductor. Other types of inductor and shield structure shapes are also useful. The shield elements 110 can be in the form of strips of polysilicon and/or be configured to form four groups or members. In one embodiment, the members are identical in shape. Providing members which are not identical in shape is also useful. The members, similar to the shield elements, are separated by gaps.

In one embodiment, the members comprise triangular shapes which, when arranged together, form a square. For example, the members are in the form of generally isosceles triangles. The members are also in the form of right-angled triangles. The shield elements are configured to form comb-like members. Shield elements 110 of each respective comb-like member 130 are oriented perpendicular to respective edges 121, 122, 123, 124 of the shield structure 100. Such configuration produces conductive lines which are substantially parallel to the inductor.

Mutually confronting edges of adjacent comb-like members 130 are separated by a small gap of substantially the same width as the gap between adjacent shield elements 110 of each comb-like member 130. In one embodiment, the width of the gap is about 0.5 μm. In alternative embodiments, the gap may be smaller or larger than 0.5 μm. In some embodiments of the invention, the gap is about 0.38 μm.

In one embodiment of the invention, each comb-like member 130 has 16 shield elements 110 each of width about 25 μm. In some embodiments, the width of each shield element 110 is from about 6 μm to about 25 μm. In some embodiments, the number of shield elements 110 in each comb-like member 130 is about 16 to about 25. Other numbers of shield elements are also useful. If the shield elements 110 are too narrow, a substantial amount of noise can be generated in the shield elements 110, which interferes with the field of the inductor. Consequently, limited enhancement of the Q value of the inductor is observed in the presence of the shield structure 100 when the shield elements 110 are too narrow.

Providing members with other shapes or other numbers of members to form other shaped shield structures is also useful. The shapes and configuration of the shield elements can be selected to provide optimal performance for different types or shapes of inductors. For example, as shown in FIG. 3, eight triangular shaped members are arranged to form an octagonal shaped or "radial" shield structure 300. The shield elements 310 of each respective member are oriented perpendicular to respective edges of the shield structure.

Referring back to FIG. 1, a ground strap 140 in accordance with one embodiment of the invention is provided around the periphery of the shield structure. In one embodiment, the ground strap comprises at least one gap 145. Providing a gap prevents closed-loop current formation within the ground strap 140. As shown, the ground strap comprises first and second gaps, forming a pair of C-shaped strap portions 141, 142. The strap portions 141, 142 are provided around respective halves of the outer periphery of the structure formed by the four comb-like members, i.e. along respective edges 121, 122, 123 and 124 of the shield structure 100. A gap 145 is provided between opposed ends of the strap portions 141, 142. The strap portions 141, 142 are arranged such that each shield element 110 is connected to one of the strap portions 141, 142.

In some embodiments, only one gap 145 is provided in the ground strap 140. In alternative embodiments, three gaps 145 are provided. In further alternative embodiments, four gaps 145 are provided, one along each side 121, 122, 123, 124 of the comb-like members 130. In still further embodiments of the invention, a greater number of gaps 145 are provided.

Alternatively, the ground strap can be provided within the shield structure or in a combination of at the periphery of and within the ground shield. The ground strap is configured to avoid closed-loop current formation within the shield structure or ground strap 140. For example, the ground strap can be configured as an X shaped ground strap along the diagonals of the square shield structure. To prevent closed loop current formation, one or more gaps can be provided at or near the intersection of the diagonal strips of the ground strap.

In one embodiment of the invention, one or more diffusion regions are provided in the substrate. In one embodiment, a diffusion region mirroring the ground strap is provided in the substrate. The ground strap is coupled to the diffusion region or regions by, for example, contacts. The diffusion region or regions serve as a grounding point for the shield elements and the substrate underneath.

In one embodiment of the invention, the straps 141, 142 are arranged to be connected to ground, thereby to sink to ground a displacement current that is generated in the shield elements 110. The displacement current is generated by the electric potential difference between the inductor and the ground shield.

In one embodiment, the shield elements 110 are formed from polysilicon strips. In alternative embodiments, the shield elements 110 are formed from diffusion regions such as P+ or N+ regions in the substrate.

In further embodiments, the shield is formed by both polysilicon strips as well as diffusion strips, in various percentages. For example, as shown in FIG. 6, the shield structure 600 includes first and second shield elements 610a-b. The first shield elements are formed from the first material, such as polysilicon while the second shield elements are formed from a diffusion region in the substrate. As such, the first and second shield elements are disposed on different planes or levels of the IC. The shield elements can be staggered in the shield structure. As shown, the second shield elements are provided at every three first shield elements. Other configurations of shield elements are also useful. Furthermore, the different members can be arranged differently, for example, need not be identical or have the same staggering arrangement. As shown, no first shield elements are provided over the second shield elements. Providing first shield above one, some or all the second elements are also useful.

In some embodiments of the invention, the shield elements 110 are made of undoped high resistance polysilicon. In some embodiments, the undoped high resistance polysilicon has a resistance that is sufficiently high to prevent displacement current flow in the shield. In some preferred embodiments, the polysilicon has a resistance in the range of megaohms (MΩ).

Undoped high resistance polysilicon with a resistance in the range of MΩ has been found to prevent the flow of displacement current in the shield, whereas doped polysilicon, having a lower resistance, is sufficiently electrically conductive to sink away any displacement current via the conducting ground strap.

Inductors having shield structures formed from doped polysilicon, and inductors having shield structures formed from undoped high resistance polysilicon, are found to have higher Q values than inductors having shield structures formed from materials having values of resistivity intermediate between those of undoped high resistance polysilicon and doped polysilicon.

For 0.13 µm technology and 65 nm technology nodes, the shield elements may be formed from doped salicided polysilicon having sheet resistance in the range from about 6 to about 8 Ω/square. Alternatively, doped unsalicided polysilicon may be used. The sheet resistance of doped unsalicided polysilicon ranges from about 75 to about 320 Ω/square.

In some embodiments, the shield elements 110 are made of a combination of a diffusion region 111 and a polysilicon region 112 (FIG. 5). In some embodiments, the diffusion region 111 is provided below the polysilicon region 112, with respect to a substrate 5 oriented as shown in FIG. 5. The diffusion region 111 and polysilicon region 112 can be formed by conventional semiconductor fabrication techniques.

The relative volumes of the diffusion region 111 and polysilicon region 112 are substantially equal in some embodiments of the invention. In alternative embodiments, the diffusion region 111 has a higher volume than the polysilicon region 112. In further alternative embodiments, the diffusion region 111 has a lower volume than the polysilicon region 112. It will be appreciated that in some embodiments, the shield elements 110 have a diffusion region 111 only and no polysilicon region 112, whilst in other embodiments the shield elements 110 have a polysilicon region 112 only and no diffusion region 111.

In some embodiments of the invention, electrical contact is provided between the ground strap (formed from the metal 1 (M1) layer) and both the diffusion region 111 and the polysilicon region 112 of the shield elements 110, in order to directly ground both of these regions and the substrate.

According to one embodiment of the invention, the ground straps 141, 142 are made of copper. In alternative embodiments, the ground straps are made of aluminum. In still further embodiments, the ground straps 141, 142 are made of a mixture of aluminum and copper. In some embodiments, at least one ground strap 141, 142 is made of aluminum, and at least one ground strap 141, 142 is made of copper. In further alternative embodiments, any other suitable metallic material or combination thereof is used to form at least one of the ground straps 141, 142.

In order to avoid unwanted attenuation of the magnetic field associated with the inductor, and hence the effective inductance of the inductor, the thickness of the shield elements 110 should be much less than the skin depth of the material used to form the shield elements 110, at the required operational frequency of the inductor 100.

In embodiments of the invention, the thickness of the shield elements is substantially thinner than the skin depth of the material from which the shield elements 110 are made.

Salicided polysilicon is one of the preferred materials for forming the shield elements 110 since the thickness of doped polysilicon is about half that of the thinnest metal layer that can be formed in standard CMOS metallisation processes.

For example, for 0.13 µm technology, the first metal layer of the metallisation process, 'metal 1' (M1), has a thickness of 0.31 µm, whilst the second layer of the metallisation process, 'metal 2' (M2) has a thickness of 0.42 μm. The polysilicon thickness, on the other hand, is about 0.16 μm.

Examples of the dimensions of polysilicon and copper layers from which shield elements and a ground strap, respectively, have been fabricated in 0.13 μm technology node are as follows. For polysilicon at 10 GHz, having a resistivity of $1.12 \times 10^{-6}$ Ωm, the skin depth is about 5 μm and the shield element thickness was fabricated to be about 0.16 μm. For copper at 10 GHz, having a resistivity of about $1.69 \times 10^{-8}$ Ωm, the skin depth is around 0.65 μm, and the ground strap 140 was fabricated to be about 0.31 μm in thickness.

For polysilicon at 2.45 GHz, having a resistivity of $1.12 \times 10^{-6}$ Ωm, the skin depth is about 10.7 μm and the shield element thickness was fabricated to be about 0.16 μm. For copper at 2.45 GHz, having a resistivity of about $1.69 \times 10^{-8}$ Ωm, the skin depth is about 1.3 μm, and the ground strap 140 was fabricated to be about 0.31 μm in thickness.

The skin depth of polysilicon at 10 GHz is about 5 μm; in this case, the typical thickness of the shield was fabricated to be around 0.16 μm.

A further advantage of the use of a non-metallic material for the formation of the shield strips 110 is that the first metal layer of the metallisation process ('metal 1') can be used to form the inductor coil (for example, for the formation of a stacked transformer). In some embodiments, a stacked transformer may require the use of all the metal layers starting from the lowest metal layer (metal 1) for its fabrication.

The first metal layer can, in addition, be used to form the ground strap 140 in the case of shield structures 100 according to one embodiment of the invention. This is at least in part because the ground strap 140 fringes the periphery of the shield structure and does not underlie any portion of the inductor 170. Therefore, the same metal layer can be used to form a portion of an inductor 170 of a transformer structure, in addition to being used to form the ground strap 140 of a shield structure 100.

The use of a metal layer to form the ground strap 140 has the advantage that improved grounding of the shield structure 100 may be conveniently provided. This is at least partly due to the fact that the resistivity of metals is generally about 100 times smaller than the resistivity of salicided polysilicon.

It is important that sufficient and relatively even grounding of all the shield elements 110 is provided. In some embodiments of the invention, the ground strap 140 is longer than the shield elements 110. Therefore forming the ground strap 140 from a material having much lower resistivity than the material from which the shield elements 110 are formed has the advantage of ensuring that currents induced in the shield elements 110 are conducted to ground in an efficient manner.

The shield elements 110 are formed so that the shield elements are generally at an angle of at least 30° to portions of an inductor coil formed directly above respective strips.

The geometry of FIG. 1 can be seen to provide this effect. For example, in the case of shield strips 111, 112, 113 and 114, it can be seen that these strips are at generally 45° to the portion 172 of inductor 170 overlying these strips. Similarly, it can be seen that shield strips 115, 116 and 117 are generally perpendicular to the portion 173 of inductor 170 overlying these strips.

FIG. 4 shows an inductor structure 175 formed on a shield structure 100 according to one embodiment of the invention. According to one embodiment of the invention, the shield structure 100 extends laterally beyond an outer periphery of the inductor 175. Inductor 175 has inductor leads 177 at opposed ends of the inductor which extend from the inductor towards an edge 122 of the shield structure 100. A length B of the inductor leads (FIG. 4) according to one embodiment of the invention is about 15 μm. A length A of the distance between a periphery 176 of the inductor 175 and outer edges of the shield structure 121, 123, 124 is about 55 μm.

The length B is known as the inductor lead length. Changing B affects the inductance value and hence the self-resonant frequency of the inductor 175.

In alternative embodiments of the invention, the length B of the inductor leads 177 is at least 5 μm. In some embodiments, B is from about 15 μm to about 55 μm. In further embodiments of the invention, B is about 35 μm.

In some embodiments of the invention, the length A is at least 5 μm. In some embodiments, A is from about 15 μm to about 55 μm. In further embodiments of the invention, A is about 35 μm.

The larger the values of A and B, the larger the area of the silicon substrate occupied by the shield structure 100. Therefore, in some embodiments of the invention, the values of A and B are adjusted in order to reduce the amount of substrate area occupied by the shield structure without overly compromising the value of Q of the inductor. In an embodiment of the invention, the shield structure has a value of A and B of about 35 μm.

According to one embodiment of the invention, the shield structure 100 is of a generally square shape. In alternative embodiments of the invention, the shield structure may be of rectangular, circular, or elliptical shape. In still further embodiments, the shield structure may be polygonal in shape. For example, it may have 3 sides, 4 sides, 5 sides, 6 sides, 7 sides, 8 sides, or a greater number of sides.

An inductor according to one embodiment of the invention is of generally hexagonal shape. It will be appreciated that the inductor may be formed to have any suitable number of sides, such as 3 sides, 4 sides, 5 sides, 7 sides, 8 sides or any other suitable number. In some embodiments of the invention, the inductor is of generally circular shape.

Furthermore, an inductor according to the first embodiment is of generally spiral shape. In other words, successive turns of the structure are of decreasing diameter.

It will be appreciated that in some embodiments of the invention, each turn of the inductor is of substantially the same diameter, successive turns being displaced with respect to one another along a direction normal to the plane of the shield structure. In other words, the inductor may be of a generally helical construction, being formed in a 'stacked' configuration.

It will further be appreciated that in some embodiments of the invention, the shield structure is fabricated above the inductor, in addition to or instead of below the inductor.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method of forming an integrated circuit comprising:
providing a substrate; and
forming on the substrate a shield structure comprising a shield member and a ground strap, wherein the shield member is configured to extend from a centre of an inductor to beyond an outer periphery of the inductor;
wherein the shield member comprises a non-metallic portion, and the ground strap comprises a metallic portion.

2. The method as claimed in claim 1 wherein the shield member comprises at least one conductive region.

3. The method as claimed in claim 2 wherein the at least one conductive region is arranged substantially to inhibit an inducement of eddy current in the shield structure by a current in an inductor associated with the shield structure.

4. The method as claimed in claim 3 wherein the at least one conductive region comprises a comb pattern of a plurality of conductive line elements.

5. The method as claimed in claim 1 wherein the shield member and ground strap are formed in the substrate.

6. The method as claimed in claim 1 wherein the substrate comprises a dielectric material.

7. A method of claim 1 wherein the shield member is configured to extend beyond the outer periphery of the inductor by at least 5 µm.

8. A method of forming an integrated circuit comprising:
providing a substrate;
providing an inductor; and
forming on the substrate a shield structure comprising a shield member and a ground strap,
wherein the shield member comprises a non-metallic portion, and the ground strap comprises a metallic portion, wherein the inductor has an inductor axis, the inductor axis being arranged to be substantially normal to a plane of the shield structure, the inductor axis passing through a centre of the inductor.

9. The method as claimed in claim 8 wherein the at least one conductive region is oriented at an angle of at least substantially 30° to corresponding conductive track portions of the inductor, said corresponding conductive track portions being located directly above or below the at least one conductive region with respect to a direction parallel to the inductor axis.

10. The method as claimed in claim 8 wherein said at least one conductive region is arranged not to pass through said inductor axis.

11. A method of forming a semiconductor device comprising:
providing a substrate;
forming a shield member on the substrate, the shield member comprising a first material, wherein the shield member is configured to extend from a centre of an inductor to beyond an outer periphery of the inductor; and
forming a shield strap coupled to the shield member, the shield strap comprising a second material, wherein the second material comprises a metallic material and is different from the first material.

12. The method of claim 11, wherein the first material comprises a non-metallic material.

13. The method of claim 12, wherein the first material comprises undoped polysilicon, doped polysilicon or salicided doped polysilicon.

14. The method of claim 13 further comprising forming a first portion of the shield member comprising the first material and a second portion of the shield member comprising a third material wherein the third material comprises a diffusion region in the substrate.

15. The method of claim 14 wherein the second material comprises aluminum or copper.

16. The method of claim 12, wherein the first material is conductive.

17. The method of claim 12 wherein the shield member comprises polysilicon having a resistance in the range of megaohms.

18. The method of claim 11 wherein the second material comprises aluminum or copper.

19. The method of claim 11 wherein the shield strap is disposed around a periphery of the shield member.

20. A method of claim 11 wherein the shield member is configured to extend beyond the outer periphery of the inductor by at least 5 µm.

21. A method of forming a semiconductor device comprising:
providing a substrate;
forming a shield member on the substrate, the shield member comprising a first material;
forming a shield strap coupled to the shield member, the shield strap comprising a second material, wherein the second material comprises a metallic material and is different from the first material; and
forming first and second shield elements, wherein the first shield element comprises the first material and the second element comprises a third material, the third material being doped diffusion regions.

22. The method as claimed in claim 21 wherein the first and second shield elements are arranged in vertical overlap.

23. A method of forming a semiconductor device comprising:
providing a substrate;
forming a shield member on the substrate, the shield member comprising a first material;
forming a shield strap coupled to the shield member, the shield strap comprising a second material, wherein the second material comprises a metallic material and is different from the first material; and
forming an inductor, wherein combination of the shield member and ground strap from the inductor axis beyond a periphery of an inductor.

24. The method of claim 23 wherein the inductor comprises an operational frequency and wherein at least a portion of the shield member has a thickness less than the skin depth of the portion of the shield member at the operational frequency.

25. A method of forming an integrated circuit structure comprising:
providing a substrate; and
a shield member and a ground strap formed on the substrate, wherein the shield member comprises a plurality of conductive regions formed from a non-metallic material and arranged substantially to inhibit an inducement of eddy current in the shield member by a current in an inductor disposed adjacent to a shield portion, and the ground strap comprises a metallic portion, wherein the shield member is configured to extend from a centre of the inductor to beyond an outer periphery of the inductor.

26. A method of claim 25 wherein the shield member is configured to extend beyond the outer periphery of the inductor by at least 5 µm.

* * * * *